(12) United States Patent
Fossum et al.

(10) Patent No.: US 6,559,856 B1
(45) Date of Patent: May 6, 2003

(54) APPARATUS FOR FIXED-POINT GRAPHICS AND METHOD THEREFOR

(75) Inventors: Gordon Clyde Fossum, Austin, TX (US); Thomas Winters Fox, Georgetown, TX (US); Bimal Poddar, El Dorado Hills, CA (US); Harald Jean Smit, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/392,835

(22) Filed: Sep. 9, 1999

(51) Int. Cl.[7] .............................. G09G 5/02; G06F 7/00; G06F 15/00
(52) U.S. Cl. ....................... 345/600; 345/426; 345/503; 708/204; 708/208
(58) Field of Search .................. 345/426, 600, 345/605, 503; 708/204, 208

(56) References Cited

U.S. PATENT DOCUMENTS

| | | | | |
|---|---|---|---|---|
| 5,561,615 A | * | 10/1996 | Kuo et al. | 708/204 |
| 5,905,663 A | * | 5/1999 | Nash | 708/204 |
| 5,936,629 A | * | 8/1999 | Brown et al. | 345/426 |
| 6,049,343 A | * | 4/2000 | Abe et al. | 345/501 |
| 6,141,013 A | * | 10/2000 | Nelson et al. | 345/426 |

* cited by examiner

Primary Examiner—Ulka J. Chauhan
(74) Attorney, Agent, or Firm—Barry S. Newberger; Winstead Sechrest & Minick P.C.; Mark E. McBurney

(57) ABSTRACT

Lighting parameters are received as floating-point numbers from a software application via an application programming interface (API). The floating-point numbers are converted to a fixed-point representation having a preselected number of bits. The number of bits is selected in accordance with a predetermined number of bits required by a frame buffer, which thus establishes the number of color values supported by the graphics display system. In order to preserve accuracy to within the number of bits in each value in the frame buffer, the representation in the fixed-point engine includes additional bits relative to the number of bits in the color values sent to the frame buffer. Floating-point values received via the graphics API are converted to fixed-point representations by first prescaling the floating-point values. The fixed-point operations generate a lighting signal value in accordance with a lighting model, and the number of bits therein is reduced to correspond to the number of bits in each data value required by the frame buffer, and the lighting data values are sent as color values to the frame buffer.

28 Claims, 3 Drawing Sheets

APPARATUS FOR FIXED-POINT GRAPHICS AND METHOD THEREFOR

TECHNICAL FIELD

The present invention relates in general to data processing systems, and in particular, to the rendering of graphics objects using fixed-point arithmetic.

BACKGROUND INFORMATION

Graphics application programming interfaces (APIs) commonly implemented in data processing systems, particularly personal computers (PCS), and workstations allow an application to define lighting parameters as floating-point numbers. Consequently, the graphics hardware, or engine, generates the lighting values in response to an underlying lighting model using floating-point operations. These lighting values are then loaded into a frame buffer, which drives a display device, as fixed-point numbers having a predetermined number, n, of bits. For example, the data values in the frame buffer may be eight-bit values corresponding to 256 color levels.

In the graphics hardware, it is faster and less expensive from a resource standpoint to perform fixed-point operations rather than floating-point operations. Thus, there is a need in the art for an apparatus and method for performing graphics lighting using fixed-point operations, without suffering a loss of accuracy relative to graphics lighting performed using floating-point calculations.

SUMMARY OF THE INVENTION

The aforementioned needs are addressed by the present invention. Accordingly there is provided, in a first form, a fixed-point graphics apparatus. The apparatus contains first logic that is operable for converting a first operand to a first fixed point data value having a preselected number of bits. The first logic generates the first fixed point data value using a first predetermined scaling in response to the preselected number of bits. The apparatus further includes second logic that is operable for converting a second operand to a second fixed point data value having the preselected number of bits. The second logic generates the second fixed point data value using a second predetermined scaling in response to the preselected number of bits and a number of bits in a color data value. The first and second fixed point data values are operable for generating a color data value in accordance with a preselected lighting model.

There is also provided, in a second form, a fixed-point graphics method. The method includes converting a first operand to a first fixed point data value having a preselected number of bits. The method converts using a first predetermined scaling in response to the preselected number of bits. A second operand is converted to a second fixed point data value having the preselected number of bits using a second predetermined scaling in response to the preselected number of bits and a number of bits in a color data value. The first and second fixed point data values are operable for generating a color data value in accordance with a preselected lighting model.

Additionally, there is provided, in a third form, a data processing system. The data processing system contains a memory, a central processing unit (CPU), and a fixed-point graphics unit. The fixed-point graphics unit is operable for receiving one or more first and second floating point operands from the CPU in response to at least one of the instructions stored in the memory which corresponds to a preselected graphics application programming interface (API). The fixed point graphics unit includes logic operable for converting the first operands to corresponding fixed point data values having a preselected number of bits. The logic generates the fixed point data value using a predetermined scaling in response to the preselected number of bits. The fixed-point unit also includes logic operable for converting the second operands to corresponding second fixed point data values having the preselected number of bits. The second fixed point data values are generated by the logic using a second predetermined scaling in response to the preselected number of bits and a number of bits in a color data value. The first and second fixed point data values are operable for generating a color data value in accordance with a preselected lighting model corresponding to the API.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
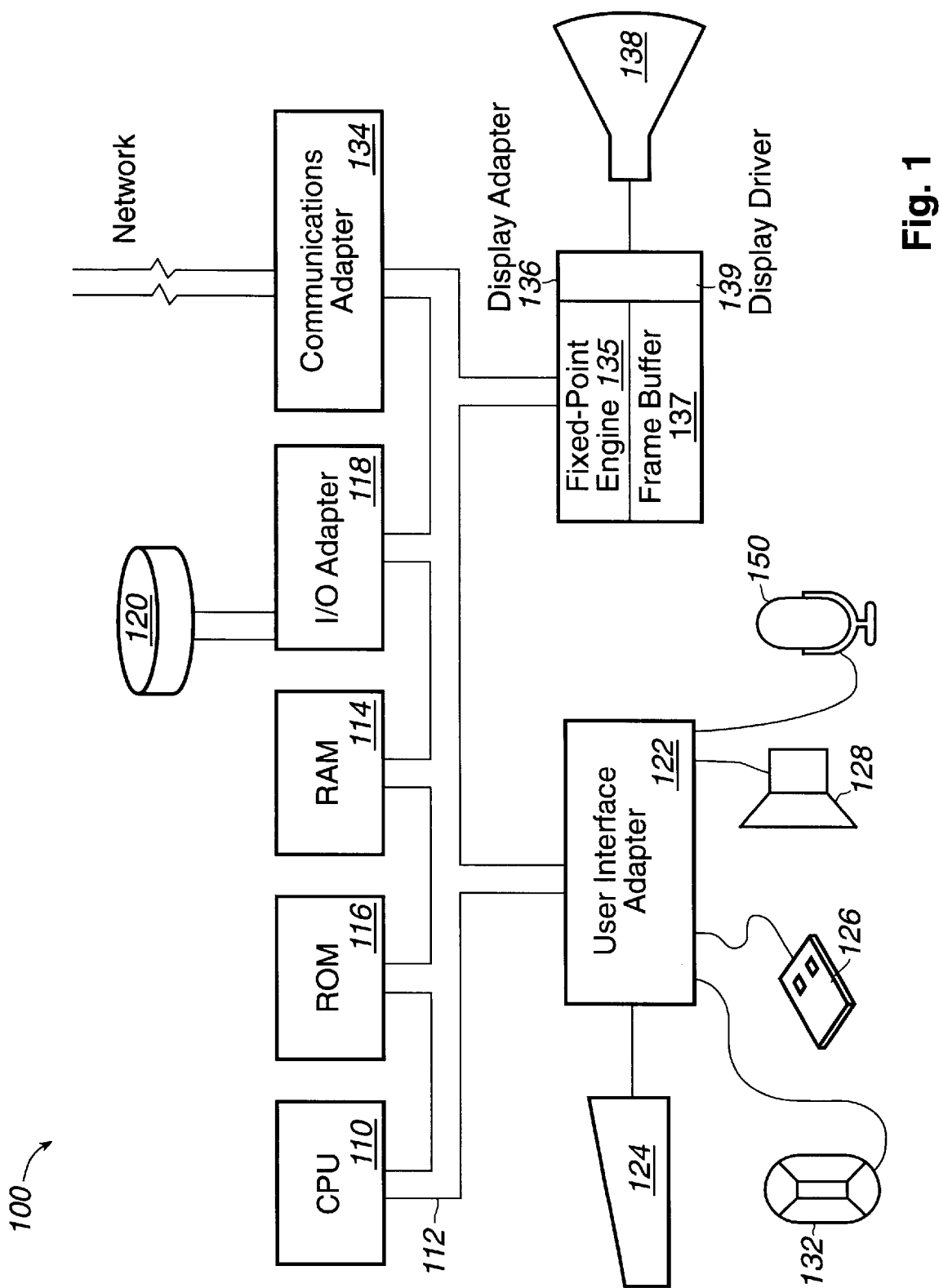
FIG. 1 illustrates, in block diagram form, a data processing system in accordance with an embodiment of the present invention.

Lighting parameters are received as floating-point numbers from a software application via an application programming interface (API). The floating-point numbers are converted to a fixed-point representation having a preselected number of bits. The number of bits is selected in accordance with a predetermined number of bits required by a frame buffer, which thus establishes the number of color values supported by the graphics display system. In order to preserve accuracy to within the number of bits in each value in the frame buffer, the representation in the fixed-point engine includes additional bits relative to the number of bits in the color values sent to the frame buffer. Floating-point values received via the graphics API are converted to fixed-point representations by first prescaling the floating-point values. The fixed-point operations generate a lighting signal value in accordance with a lighting model, and the number of bits therein is reduced to correspond to the number of bits in each data value required by the frame buffer, and the lighting data values are sent as color values to the frame buffer.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

A representative hardware environment for practicing the present invention is depicted in FIG. 1, which illustrates a typical hardware configuration of data processing system 100 in accordance with the subject invention having central processing unit (CPU) 110, such as a conventional microprocessor, and a number of other units interconnected via system bus 112. Data Processing System 100 includes random access memory (RAM) 114, read only memory (ROM) 116, and input/output (I/O) adapter 118 for connecting peripheral devices such as disk units 120 and tape drives 140 to bus 112, user interface adapter 122 for connecting keyboard 124, mouse 126, and/or other user interface devices such as a touch screen device (not shown) to bus 112, communication adapter 134 for connecting data processing system 100 to a data processing network, and display adapter 136 for connecting bus 112 to display device 138. Display adapter 136 receives lighting parameters from CPU 110 in accordance with a lighting model and corresponding application programming interface (API). Lighting parameters are input to fixed-point engine 135 which generates a color value for each pixel to be displayed. The color values are loaded into frame buffer 137 and are used by display driver 139 to provide signals controlling display 138 which produces a visual output in response.

CPU 110 may include other circuitry not shown herein, which will include circuitry commonly found within a microprocessor, e.g., execution unit, bus interface unit, arithmetic logic unit, etc. CPU 110 may also reside on a single integrated circuit.

Figure 2:
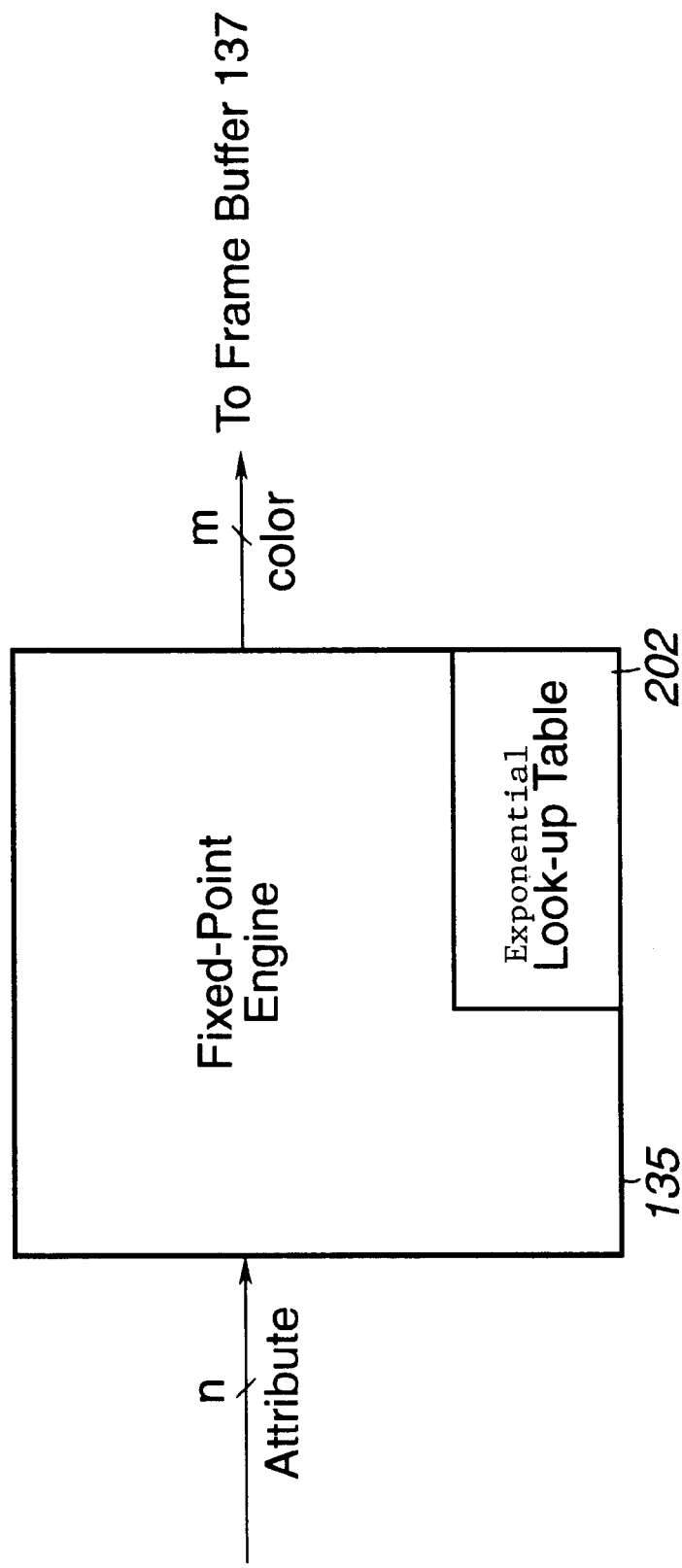
FIG. 2 illustrates, in block diagram form, a fixed-point graphics engine in conjunction with an embodiment of the present invention.

FIG. 2 illustrates a fixed-point hardware lighting engine that carries enough bits for the various lighting parameters so as to maintain the accuracy obtained with a single precision floating point system. The targeted frame buffer such as frame buffer 139, FIG. 1, contains m bits per red, green, and blue color channel. Typical embodiments of current frame buffers contain eight bits per color channel. Engine 135 receives lighting parameters as floating point values from the graphics API, which values may, for example, be represented as IEEE 32-bit floating point numbers. As discussed further in conjunction with FIG. 3, Engine 135 converts the floating point lighting parameters to n-bit fixed point values, and outputs m-bit color values to the frame buffer, as required thereby. Typical lighting models include specular reflection terms that require lighting parameters be raised to powers. A lookup table 202 is included in fixed-point engine 135 to generate the required exponentiations. In an alternative embodiment, a brute force computational exponentiation could be used. However, using lookup table 202 provides faster performance with fewer resources, albeit with a reduction in precision. The error associated with a predetermined fixed-point representation having n bits will be discussed in detail below in conjunction with FIG. 3.

At each stage in the lighting equation, some precision is lost due to multiplications, and approximations like the specular exponent calculations. An error analysis, using an exemplary embodiment having eight bits per color channel, will show just how many bits need to be used for each attribute so that the final value for each channel has an error less than one in nine bits or 1/512. As long as this error is not exceeded, any error will be indistinguishable from normal rounding error.

Figure 3:
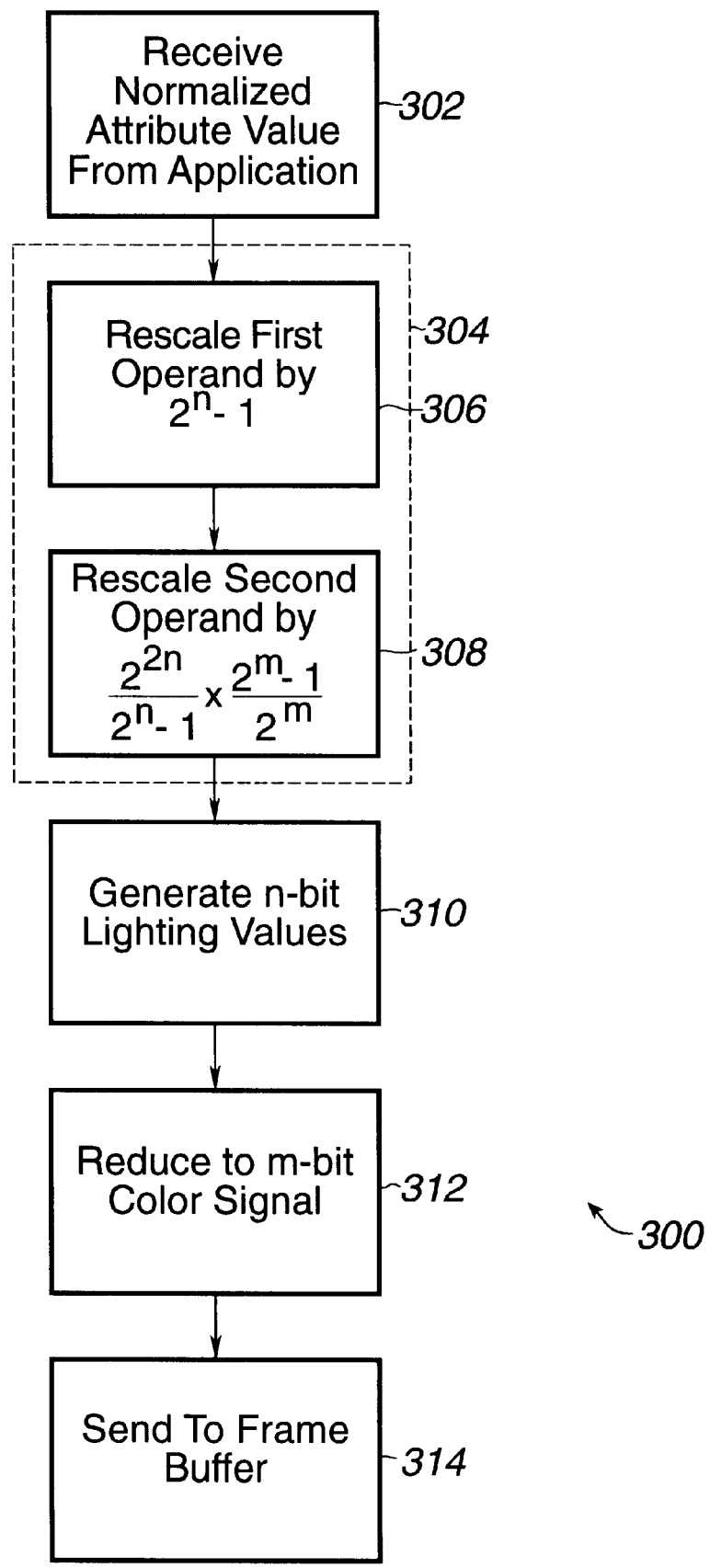
FIG. 3 illustrates, in flowchart form, a fixed-point graphics rendering methodology in accordance with an embodiment of the present invention.

Refer now to FIG. 3 illustrating, in flow chart form, a fixed-point lighting methodology 300 in accordance with the present invention. In step 302, floating point lighting parameters are received from the graphics API, such as the OpenGL™ and graPHIGS™ APIs. The floating point values are converted to a fixed point representation, in step 304. The number of bits, n, in the fixed point representation is predetermined in accordance with the number of bits, m, in the color values required by the frame buffer, as previously discussed. The number of bits, n, is determined such that the quantization error introduced by the fixed point representation does not propagate into the final color values. An exemplary solution will be provided for the OpenGL™ API. It would be understood by an artisan of ordinary skill that a similar solution can be generated for the graPHIGS™ API as well.

The OpenGL equation for lighting in its general form is as follows:

$$\text{Color} = e_{cm} + a_{cm}a_{cs} + \sum_{i=0}^{n-1}(att_i)(spot_i)[a_{cm}a_{cli} + (N \cdot L_i)d_{cm}d_{cli} + (f_i)(N \cdot H_i)^{s_{rm}}s_{cm}s_{cli}]$$

Where the operators and operands are defined as,

| | |
|---|---|
| . | dot product operation clamped at zero (i.e., the result is never negative) |
| $e_{cm}$ | emissive color of material |
| $a_{cm}$ | ambient color of material |
| $d_{cm}$ | diffuse color of material |
| $s_{cm}$ | specular color of material |
| $a_{cs}$ | ambient model color or ambient color of scene |
| $a_{cli}$ | ambient intensity of light source number $i$ |
| $d_{cli}$ | diffuse intensity of light source number $i$ |
| $s_{cli}$ | specular intensity of light source number $i$ |
| $N$ | surface normal vector at vertex (normalized) |
| $L_i$ | vector pointing from vertex to light source $i$ (normalized) |
| $H_i$ | half vector corresponding to light source $i$ (normalized) where the non-normalized $H_i = L_i + (0, 0, 1)$ for a viewer at $(0, 0, \infty)$ |
| $s_{rm}$ | specular exponent of material |
| $att_i$ | attenuation factor, which is 1.0 for directional light sources |
| $spot_i$ | spotlight effect, which is 1.0 for spotlight cutoff angles of 180° (lights that are not spotlights) |
| $f_i$ | $= 1.0$ when $N \cdot L_i > 0$ |
| | $= 0.0$ otherwise |

OpenGL™ and graPHIGS™ are both known graphics APIs in the graphics processing art. graPHIGS™ is an implementation by IBM Corporation of the PHIGS API).

For an infinite viewpoint and directional light sources, the OpenGL lighting equation becomes:

$$\text{Color} = \quad (1).$$

$$e_{cm} + a_{cm}a_{cs} + \sum_{i=0}^{n-1}[a_{cm}a_{cli} + (N \cdot L_i)d_{cm}d_{cli} + (f_i)(N \cdot H_i)^{Srm}s_{cm}s_{cli}]$$

One assumption is that all color values for the scene, materials and light sources are in the range [0.0, 1.0]. While this is not a requirement from OpenGL, it is common to use this range, and colors are easily detected if out of this range.

Since each of the terms in the equation is approximated by a fixed-point value, a quantization error is introduced. Re-writing the above equation by including quantization errors for each element yields:

$$\text{Color} = (e_{cm} \pm \varepsilon_{ecm}) + \quad (2).$$

$$(a_{cm} \pm \varepsilon_{acm})(a_{cs} \pm \varepsilon_{acs}) + \sum_{i=0}^{n-1}[(a_{cm} \pm \varepsilon_{acm})(a_{cli} \pm \varepsilon_{cli}) +$$

$$(N \cdot L_i \pm \varepsilon_{N \cdot Li})(d_{cm} \pm \varepsilon_{dcm})(d_{cli} \pm \varepsilon_{dcli}) +$$

$$(f_i)(N \cdot H_i^{Srm} \pm \varepsilon_{slu})(s_{cm} \pm \varepsilon_{scm})(s_{cli} \pm \varepsilon_{scli})]$$

$$\text{Color} = (e_{cm} \pm \varepsilon_{ecm}) + (a_{cm}a_{cs} \pm a_{cm}\varepsilon_{acs} \pm a_{cs}\varepsilon_{acm} \pm \varepsilon_{acm}\varepsilon_{acs}) + \quad (3).$$

$$\sum_{i=0}^{n-1}[(a_{cm}a_{cli} \pm a_{cm}\varepsilon_{acli} \pm a_{cli}\varepsilon_{acm} \pm \varepsilon_{acm}\varepsilon_{acli}) +$$

$$(N \cdot L_i d_{cm} d_{cli} \pm N \cdot L_i d_{cm}\varepsilon_{dcli} \pm N \cdot L_i \varepsilon_{dcm} d_{cli} \pm N \cdot L_i \varepsilon_{dcm}\varepsilon_{dcli} \pm$$

$$\varepsilon_{N \cdot Li} d_{cm} d_{cli} \pm \varepsilon_{N \cdot Li} d_{cm}\varepsilon_{dcli} \pm$$

$$\varepsilon_{N \cdot Li}\varepsilon_{dcm} d_{cli} \pm \varepsilon_{N \cdot Li}\varepsilon_{dcm}\varepsilon_{dcli}) +$$

$$(f_i)(N \cdot H_i^{Srm} s_{cm} s_{cli} \pm N \cdot H_i^{Srm} s_{cm}\varepsilon_{scli} \pm N \cdot H_i^{Srm}\varepsilon_{scm} s_{cli} \pm$$

$$N \cdot H_i^{Srm}\varepsilon_{scm}\varepsilon_{scli} \pm \varepsilon_{slu} s_{cm} s_{cli} \pm$$

$$\varepsilon_{slu} s_{cm}\varepsilon_{scli} \pm \varepsilon_{slu}\varepsilon_{scm} s_{cli} \pm \varepsilon_{slu}\varepsilon_{scm}\varepsilon_{scli})]$$

$N \cdot L_i$ can be expanded as follows:

$$N \cdot L_i = (N_{xi} \pm \varepsilon_{Nxi})(L_{xi} \pm \varepsilon_{Lxi}) + (N_{yi} \pm \varepsilon_{Nyi})(L_{yi} \pm \varepsilon_{Lyi}) + (N_{zi} \pm \varepsilon_{Nzi})(L_{zi} \pm \varepsilon_{Lzi}) \quad (4).$$

Assuming that the error in representation of each of the components of the vectors is identical, the above reduces to:

$$N \cdot L_i = (N_{xi} \pm \varepsilon_{Ni})(L_{xi} \pm \varepsilon_{Li}) + (N_{yi} \pm \varepsilon_{Ni})(L_{yi} \pm \varepsilon_{Li}) + (N_{zi} \pm \varepsilon_{Ni})(L_{zi} \pm \varepsilon_{Li}) \quad (5).$$

$$\varepsilon_{N \cdot Li} = \pm N_{xi}\varepsilon_{Li} \pm L_{xi}\varepsilon_{Ni} \pm \varepsilon_{Li}\varepsilon_{Ni} \pm N_{yi}\varepsilon_{Li} \pm L_{yi}\varepsilon_{Ni} \pm \varepsilon_{Li}\varepsilon_{Ni} \pm N_{zi}\varepsilon_{Li} \pm L_{zi}\varepsilon_{Ni} \pm \varepsilon_{Li}\delta_{Ni} \quad (6).$$

where $\varepsilon_{Li}$ is the error in any component (x,y, or z) of the vector $L_i$, The maximum $\varepsilon_{N \cdot Li}$ occurs at $\quad (7).$ $$N_{xi} = N_{yi} = N_{zi} = L_{xi} = L_{yi} = L_{zi} = \frac{1}{\sqrt{3}}$$

Then $$\text{Maximum } \varepsilon_{N \cdot Li} = \frac{3}{\sqrt{3}}\varepsilon_{Li} + \frac{3}{\sqrt{3}}\varepsilon_{Ni} + 3\varepsilon_{Li}\varepsilon_{Ni}$$

$$= \sqrt{3}\,\varepsilon_{Li} + \sqrt{3}\,\varepsilon_{Ni} + 3\varepsilon_{Li}\varepsilon_{Ni}$$

The specular term involves an exponentiation of the dot product of two vectors. Since this exponent is usually constant over a large number of vertices, and is constrained to the values [0.0, 128.0], in an embodiment of the present invention, a table lookup and interpolation can be performed to approximate the exponential using a lookup table such as table 202, FIG. 2. The table lookup provides faster performance with fewer resources at the expense of less precision as compared to a brute force exponentiation. However, as shown below, the loss of precision with the lookup does not affect the final precision of the eight bit color channels. The values and analysis below are relative to a table size of sixty-four, sixteen-bit entries. It can be shown, as described below, that the error in the specular lookup ($\varepsilon_{slu}$), for the specified table, is only slightly greater than $2^{-10}$ in the worst case. If desired, this error could be reduced if more table entries were added.

Combining all of the above error terms, assumptions and the initial statement of the maximum error of $2^{-9}$ for color values having m-bit representation with m equal to eight, one gets the following equation:

$$\text{Color} = (e_{cm} \pm \varepsilon_{ecm}) + (a_{cm}a_{cs} \pm a_{cm}\varepsilon_{acs} \pm a_{cs}\varepsilon_{acm} \pm \varepsilon_{acm}\varepsilon_{acs}) + \quad (8).$$

$$\sum_{i=0}^{n-1}[(a_{cm}a_{cli} \pm a_{cm}\varepsilon_{acli} + a_{cli}\varepsilon_{acm} \pm \varepsilon_{acm}\varepsilon_{acli}) +$$

$$(N \cdot L_i d_{cm} d_{cli} \pm N \cdot L_i d_{cm}\varepsilon_{dcli} \pm N \cdot L_i \varepsilon_{dcm} d_{cli} \pm$$

$$N \cdot L_i \varepsilon_{dcm}\varepsilon_{dcli} \pm \sqrt{3}\,\varepsilon_{Li} d_{cm} d_{cli} \pm \sqrt{3}\,\varepsilon_{Ni} d_{cm} d_{cli} \pm$$

$$3\varepsilon_{Li}\varepsilon_{Ni} d_{cm} d_{cli} \pm \sqrt{3}\,\varepsilon_{Li} d_{cm}\varepsilon_{dcli} \pm \sqrt{3}\,\varepsilon_{Ni} d_{cm}\varepsilon_{dcli} \pm$$

$$3\varepsilon_{Li}\varepsilon_{Ni} d_{cm}\varepsilon_{dcli} \pm \sqrt{3}\,\varepsilon_{Li}\varepsilon_{dcm} d_{cli} \pm \sqrt{3}\,\varepsilon_{Ni}\varepsilon_{dcm} d_{cli} \pm$$

$$3\varepsilon_{Li}\varepsilon_{Ni}\varepsilon_{dcm} d_{cli} \pm \sqrt{3}\,\varepsilon_{Li}\varepsilon_{dcm}\varepsilon_{dcli} \pm$$

$$\sqrt{3}\,\varepsilon_{Ni}\varepsilon_{dcm}\varepsilon_{dcli} \pm 3\varepsilon_{Li}\varepsilon_{Ni}\varepsilon_{dcm}\varepsilon_{dcli}) +$$

$$(f_i)(N \cdot H_i^{Srm} s_{cm} s_{cli} \pm N \cdot H_i^{Srm} s_{cm}\varepsilon_{scli} \pm$$

$$N \cdot H_i^{Srm}\varepsilon_{scm} s_{cli} \pm N \cdot H_i^{Srm}\varepsilon_{scm}\varepsilon_{scli} \pm$$

$$\varepsilon_{slu} s_{cm} s_{cli} \pm \varepsilon_{slu} s_{cm}\varepsilon_{scli} \pm \varepsilon_{slu}\varepsilon_{scm} s_{cli} \pm \varepsilon_{slu}\varepsilon_{scm}\varepsilon_{scli}]$$

Gathering error terms and defining $\varepsilon = \varepsilon_{ecm} = \varepsilon_{acm} = \varepsilon_{dcm} = \varepsilon_{scm} = \varepsilon_{acs} = \varepsilon_{acli} = \varepsilon_{dcli} = \varepsilon_{scli} = \varepsilon_{Li} = \varepsilon_{Ni}$ since each of these parameters will have the same number of bits yields:

$$\varepsilon_{color} = (\pm \varepsilon) + (\pm a_{cm}\varepsilon \pm a_{cs}\varepsilon \pm \varepsilon^2) + \quad (9).$$

$$\sum_{i=0}^{n-1}[(\pm a_{cm}\varepsilon \pm a_{cli}\varepsilon \pm \varepsilon^2) + (\pm N \cdot L_i d_{cm}\varepsilon \pm N \cdot L_i \varepsilon d_{cli} \pm$$

$$N \cdot L_i \varepsilon^2 \pm \sqrt{3}\,\varepsilon d_{cm} d_{cli} \pm \sqrt{3}\,\varepsilon d_{cm} d_{cli} \pm 3\varepsilon^2 d_{cm} d_{cli} \pm$$

$$\sqrt{3}\,d_{cm}\varepsilon^2 \pm \sqrt{3}\,d_{cm}\varepsilon^2 \pm 3 d_{cm}\varepsilon^3 \pm \sqrt{3}\,\varepsilon^2 d_{cli} \pm$$

$$\sqrt{3}\,\varepsilon^2 d_{cli} \pm 3\varepsilon^3 d_{cli} \pm \sqrt{3}\,\varepsilon^3 \pm \sqrt{3}\,\varepsilon^3 \pm 3\varepsilon^4) +$$

$$(f_i)(\pm N \cdot H_i^{Srm} s_{cm}\varepsilon \pm N \cdot H_i^{Srm}\varepsilon s_{cli} \pm N \cdot H_i^{Srm}\varepsilon^2 \pm$$

$$\varepsilon_{slu} s_{cm} s_{cli} \pm \varepsilon_{slu} s_{cm}\varepsilon \pm \varepsilon_{slu}\varepsilon s_{cli} \pm \varepsilon_{slu}\varepsilon^2)]$$

Light intensities, $a_{cli}$, $d_{cli}$, $s_{cli}$, and the scene ambient $a_{cs}$ are set to 1.0 to maximize the error:

$$\varepsilon_{color} = (\pm \varepsilon) + (\pm a_{cm}\varepsilon \pm \varepsilon \pm \varepsilon^2) + \sum_{i=0}^{n-1}[(\pm a_{cm}\varepsilon \pm \varepsilon \pm \varepsilon^2) + \quad (10).$$

$$(\pm N \cdot L_i d_{cm}\varepsilon \pm N \cdot L_i \varepsilon \pm N \cdot L_i \varepsilon^2 \pm \sqrt{3}\,\varepsilon d_{cm} \pm$$

$$\sqrt{3}\,\varepsilon d_{cm} \pm 3\varepsilon^2 d_{cm} \pm \sqrt{3}\,d_{cm}\varepsilon^2 \pm \sqrt{3}\,d_{cm}\varepsilon^2 \pm$$

$$3d_{cm}\varepsilon^3 \pm \sqrt{3}\,\varepsilon^2 \pm \sqrt{3}\,\varepsilon^2 \pm 3\varepsilon^3 \pm \sqrt{3}\,\varepsilon^3 \pm \sqrt{3}\,\varepsilon^3 \pm$$

-continued
$$3\varepsilon^4) + (f_i)(\pm N \cdot H_i^{Srm} s_{cm}\varepsilon \pm N \cdot H_i^{Srm}\varepsilon \pm$$
$$N \cdot H_i^{Srm}\varepsilon^2 \pm \varepsilon_{slu} s_{cm} \pm \varepsilon_{slu} s_{cm}\varepsilon \pm \varepsilon_{slu}\varepsilon \pm \varepsilon_{slu}\varepsilon^2)]$$

Next, to maximize error, set N·L=N·H=1.0, and use the positive error terms.

$$\varepsilon_{color} = (\varepsilon) + (a_{cm}\varepsilon + \varepsilon + \varepsilon^2) + \sum_{i=0}^{n-1}[(a_{cm}\varepsilon + \varepsilon + \varepsilon^2) +\qquad(11).$$
$$(d_{cm}\varepsilon + \varepsilon + \varepsilon^2 + \sqrt{3}\,\varepsilon d_{cm} + \sqrt{3}\,\varepsilon d_{cm} + 3\varepsilon^2 d_{cm} +$$
$$\sqrt{3}\,d_{cm}\varepsilon^2 + \sqrt{3}\,d_{cm}\varepsilon^2 + 3d_{cm}\varepsilon^3 +$$
$$\sqrt{3}\,\varepsilon^2 + \sqrt{3}\,\varepsilon^2 + 3\varepsilon^3 + \sqrt{3}\,\varepsilon^3 + \sqrt{3}\,\varepsilon^3 + 3\varepsilon^4) +$$
$$(s_{cm}\varepsilon + \varepsilon + \varepsilon^2 + \varepsilon_{slu} s_{cm} + \varepsilon_{slu} s_{cm}\varepsilon + \varepsilon_{slu}\varepsilon + \varepsilon_{slu}\varepsilon^2)]$$

$$\varepsilon_{color} = (a_{cm}\varepsilon + 2\varepsilon + \varepsilon^2) + \sum_{i=0}^{n-1}[(a_{cm} + d_{cm} + s_{cm} + 3 +\qquad(12).$$
$$2\sqrt{3}\,d_{cm} + \varepsilon_{slu} + \varepsilon_{slu} s_{cm})\varepsilon + (3 + 2\sqrt{3} + 3d_{cm} +$$
$$2\sqrt{3}\,d_{cm} + \varepsilon_{slu})\varepsilon^2 + (3 + 3d_{cm} + 2\sqrt{3}\,)\varepsilon^3 + 3\varepsilon^4 +$$
$$\varepsilon_{slu} s_{cm}]$$

Next, we use eight light sources to maximize the error within the OpenGL™ and graPHIGS™ API specification:

$$\varepsilon_{color} = (9a_{cm} + 8d_{cm} + 8s_{cm} + 26 + 16\sqrt{3}\,d_{cm} + 8\varepsilon_{slu} +\qquad(13).$$
$$8\varepsilon_{slu} s_{cm})\varepsilon + (25 + 16\sqrt{3} + 24d_{cm} + 16\sqrt{3}\,d_{cm} +$$
$$8\varepsilon_{slu})\varepsilon^2 + (24 + 24d_{cm} + 16\sqrt{3}\,)\varepsilon^3 + 24\varepsilon^4 + 8\varepsilon_{slu} s_{cm}$$

Both OpenGL and graPHIGS APIs specify that at least eight light sources be supported; if more light sources are potentially active, it would be understood by an artisan of ordinary skill that the number of bits in the fixed-point representation would be increased accordingly, and the coefficients in Equation (13) would be increased due to the additional terms in the summation in Equation (12). These embodiments would be recognized by an artisan of ordinary skill to be within the spirit and scope of the present invention.

Next, the material properties $\varepsilon_{cm}$, $a_{cm}$, $d_{cm}$, $s_{cm}$ are set such that the final frame buffer colors do not saturate (we set them to 1/26):

$$\varepsilon_{color} = \left(\frac{9}{26} + \frac{8}{26} + \frac{8}{26} + 26 + \frac{16}{26}\sqrt{3} + 8\varepsilon_{slu} + \frac{8}{26}\varepsilon_{slu}\right)\varepsilon +\qquad(14).$$
$$\left(25 + 16\sqrt{3} + \frac{24}{26} + \frac{16}{26}\sqrt{3} + 8\varepsilon_{slu}\right)\varepsilon^2 +$$
$$\left(24 + \frac{24}{26} + 16\sqrt{3}\,\right)\varepsilon^3 + 24\varepsilon^4 + \frac{8}{26}\varepsilon_{slu}$$

This error in the final color must be less than $2^{-9}$, since in the exemplary embodiment, the frame buffer is eight bits per color channel.

$$\left(\frac{25}{26} + 26 + \frac{16}{26}\sqrt{3} + 8\varepsilon_{slu} + \frac{8}{26}\varepsilon_{slu}\right)\varepsilon +\qquad(15).$$

-continued
$$\left(25 + 16\sqrt{3} + \frac{24}{26} + \frac{16}{26}\sqrt{3} + 8\varepsilon_{slu}\right)\varepsilon^2 +$$
$$\left(24 + \frac{24}{26} + 16\sqrt{3}\,\right)\varepsilon^3 + 24\varepsilon^4 + \frac{8}{26}\varepsilon_{slu} \leq 2^{-9}$$

$$24\varepsilon^4 + \left(24 + \frac{24}{26} + 16\sqrt{3}\,\right)\varepsilon^3 +\qquad(16).$$
$$\left(25 + \frac{24}{26} + 16\sqrt{3} + \frac{16}{26}\sqrt{3} + 8\varepsilon_{slu}\right)\varepsilon^2 +$$
$$\left(26 + \frac{25}{26} + \frac{16}{26}\sqrt{3} + 8\varepsilon_{slu} + \frac{8}{26}\varepsilon_{slu}\right)\varepsilon + \frac{8}{26}\varepsilon_{slu} \leq 2^{-9},$$

for a frame buffer, with eight bit colors.

For a specular exponent of 128.0 and a cutoff value of $2^{-10}$ chosen for the specular lookup $\varepsilon_{slu}$=0.0013502669. The scalar product N·H is bounded above by one since the vectors N and H are normalized. Thus, it would be expected that the maximum error in the exponential lookup table would occur for the largest specular exponent, se=128, because the function $(N·H)^{se}$ is then the most rapidly varying. That is, the function $(N·H)^{se}$ varies less rapidly, as a function of its argument, for (fixed) exponents smaller than the maximum of 128. Furthermore, for n bits of color resolution, all values of N·H less than a selected cutoff value may be taken to yield a value of zero for $(N·H)^{se}$. That is, the cutoff value of N·H is that predetermined value below which $(N·H)^{se}$ may be taken to be zero without loss of color resolution. The use of a cutoff allows for more granularity in the lookup table. The table entries need only span an interval of values for N·H between the cutoff value and one (1.0). For a predetermined lookup table, the error incurred by using the lookup table may be found by comparing values of the exponential at each table entry with values of exponential, calculated by computation, for values of N·H between the table entries. For a specular exponent, se=128, the value of $\varepsilon_{slu}$=0.0013502669 stated above is found. It would be understood by an artisan of ordinary skill that an embodiment of the present invention having different values for the maximum specular exponent or the selected cutoff will yield a different value for the error $\varepsilon_{slu}$, and that the error in such an embodiment may be found in the same way as described hereinabove. Solving the above polynomial equation then yields: $\varepsilon \leq 0.5483 \times 10^{-4}$.

Hence, an $\varepsilon$ value of $2^{-15}$=0.00003051757 is less than 0.00005483483. Therefore, the number of bits necessary for each parameter so as to maintain the same accuracy as seen in a floating point system is fourteen for the exemplary embodiment having m=8 bits per color channel. It would be understood by an artisan of ordinary skill that an analogous error analysis may be performed in the same way for an embodiment having other values of m, and for m>8, the fixed-point representation may have more than fourteen bits, and conversely for m<8. Such embodiments would be recognized by an artisan of ordinary skill to be within the spirit and scope of the present invention.

It should be noted that in alternative embodiments fewer bits can be chosen for some of the parameters (eg. the material properties) if the associated reduction in accuracy is compensated for with more bits for the remaining parameters (e.g. the light source properties). Or, if an implementation is willing to accept less accuracy for higher numbers of light sources, the number of bits, in yet another alternative embodiment, could be reduced while still maintaining the $2^{-9}$ accuracy for fewer numbers of light sources. It would be understood by an artisan of ordinary skill that such alternative embodiments would be within the spirit and scope of the present invention.

Conversion step 304 includes two substeps, substep 306 and 308. The lighting parameters that form operand pairs in an expression in the lighting equation, such as the lighting equation in the OpenGL API, Equation (1), are each converted differently, in the present invention. In this way, intermediate rescaling operations are avoided without having to increase the number of bits in the fixed point representation beyond that demanded by the quantization error limit needed to preserve the accuracy of the color values, as previously described.

Typically, when floating point numbers are represented using integers, the conversion uses a factor of $(2^n-1)$ where n is the number of bits used for the integer format. With this representation, the addition of two numbers in n bit space preserves the n bit representation. Thus, if $$A_n + B_n = C_n \tag{17}$$

then it does not matter whether the conversion to floating point is done before or after addition, the results are going to be the same. Then, $$\frac{A_n}{2^n - 1} + \frac{B_n}{2^n - 1} = \frac{C_n}{2^n - 1} \tag{18}$$

Number $C_n$ is also in the n bit space. This same fact is not true for multiplication. Consider, $$A_n \times B_n = C_n \tag{19}$$

In this case, $$\frac{A_n}{2^n - 1} \times \frac{B_n}{2^n - 1} \neq \frac{C_n}{2^n - 1} \tag{20}$$

In order to convert $C_n$ back to the floating point space, one needs to divide $C_n$ by $(2^n-1)^2$. Hence, for multiplication using integer representation for numbers, in general requires rescaling the result at each stage to convert to n bit space or compensate for the error by using more bits for representing the numbers in the integer format.

Using one additional bit for representing numbers, i.e. the conversion to integer representation is done using a factor of $2^n$, $$\frac{A_n}{2^n} \times \frac{B_n}{2^n} = \frac{\left(\frac{C_n}{2^n}\right)}{2^n} \tag{21}$$

The drawback of this method is that it requires two additional bits—one for each multiplicand.

The present invention uses equation (21) without using an additional bit for representing the multiplicands by taking advantage of the larger number of bits in intermediate results than the m bits that are needed in the final color values. We get more accuracy using the same number of bits as would be done using a scheme where both A and B are represented using $(2^n-1)$.

Consider for example a case in which the final result is desired in eight bit space (0-255) and the intermediate values are in a 14 bit space (0-16383). Multiplying two numbers in 16383 space results in the problem described in equation (20). Instead, we keep both the numbers in the 16384 space.

As mentioned in equation (21), the result of the product of the two numbers is in the 163842 space, which is the sameas 16384 space.

$$(A_f \times 16384) \times (B_f \times 16384) = (C_f \times 16384) \times 16384 \tag{22}$$

We need fifteen bits to represent both $A_f$ and $B_f$, where $A_f$ and $B_f$ are floating point numbers. We can re-write this equation as:

$$(A_f \times 16383) \times \left(B_f \times \left(\frac{16384}{16383}\right)\right) \times 16384 = (C_f \times 16384) \times 16384 \tag{23}$$

Just by rearranging, we have now reduced the number of bits required for A. A now requires fourteen bits, while B still requires fifteen bits and is multiplied by (16384/16383) before being converted to an integer. In this case, the final conversion of $B_f$ requires a factor of $(16384^2/16383)$ which still converts $B_f$ in [0.0,1.0] to B in [0,$16384^2$/16383].

Now, since C is required in the 255 space, we pre-multiply by (255/256) (256 just corresponds to a shift of the radix point):

$$(A_f \times 16383) \times \left(B_f \times \frac{255}{256} \times \frac{16384}{16383}\right) \times 16384 = \left(C_f \times \frac{255}{256}\right) \times 16384 \times 16384 \tag{24}$$

or $$(A_f \times 16383) \times (B_f \times 16320.996) = (C_f \times 255) + \text{Shifts Of Radix}$$

Now, $B_f$ is converted using a factor of 16320.996, which is less than 16383. Hence, even the maximum $B_f$ value of 1.0 converts only to 16321 as an integer, which is less than 16383, and thus requires only fourteen bits.

Thus, returning to the general case, in step 306 a first operand is rescaled by $2^n-1$. In step 308, a second operand is rescaled by $(2^{2n}/(2n-1)) \cdot (2^m-1)/2^m)$. The exemplary scale factors in Equation (24) above correspond to m=8, and n=14. In step 310, the fixed-point, n-bit lighting values are generated in step 310 in accordance with a lighting model, such as Equation (1) for the OpenGL™ API, or corresponding model for other APIs, for example the graPHIGS™ API. It would be understood by an artisan of ordinary skill in the art that the fixed-point generation of lighting values in accordance with the present invention does not depend on the particular API used, although the particular value of n for a given value of m may depend on the API used.

In step 312, the n-bit lighting values are reduced to m-bit color values as required by the frame buffer. In an embodiment of the present invention, the reduction step may be a clamped roundoff. In such an embodiment the least significant (n-m) bits are rounded off with the resulting m-bit value representing the color value to be sent to the frame buffer. However, the rounding is clamped, wherein an n-bit lighting signal having a value such that the uppermost m bits would roll over if rounded, is truncated. That is,the upper m-bits are clamped. Additionally, in an alternative embodiment, the reduction step 312 may be implemented by truncating the (n-m) least significant bits. After reduction to m bits, the resulting color values are sent to the frame buffer, in step 314.

In this way, a fixed-point lighting mechanism is provided. The mechanism generates color value signals from a lighting API using fixed-point operations while maintaining errors within the granularity of the frame buffer.

Although the present invention and its advantages have been described in detail, it should be understood that various changes, substitutions and alterations can be made herein without departing from the spirit and scope of the invention as defined by the appended claims.

What is claimed is:

1. A fixed-point graphics apparatus comprising:
   first logic operable for converting a first operand to a first fixed point data value having a preselected number of bits, said first logic generating said first fixed point data value using a first predetermined scaling in response to said preselected number of bits; and
   second logic operable for converting a second operand to a second fixed point data value having said preselected number of bits, said second logic generating said second fixed point data value using a second predetermined scaling in response to said preselected number of bits and a number of bits in a color data value, wherein said first and second fixed point data values are operable for generating a color data value in accordance with a preselected lighting model, wherein said first predetermined scaling is $(2^n - 1)$, and said second predetermined scaling is $(2^{2n}/2^n - 1) \cdot ((2^m - 1)/2^m)$, and wherein said preselected number of bits is n, and said number of bits in said color data value is m.

2. The apparatus of claim 1 wherein said first and second operands correspond to lighting parameters in accordance with said preselected lighting model.

3. The apparatus of claim 1 further comprising a fixed-point arithmetic unit operable for generating one or more color data values in response to one or more first and second fixed point-data values.

4. The apparatus of claim 3 wherein said fixed-point arithemetic unit includes an exponential lookup table.

5. The apparatus of claim 3 wherein said fixed-point arithmetic unit includes third logic operable for reducing a fixed-point output data value generated in response to said first and second fixed-point data values to said output color data value.

6. The apparatus of claim 5 wherein said third logic is operable for truncating said fixed-point output data value to a corresponding color data value.

7. The apparatus of claim 5 wherein said third logic circuitry is operable for clamped rounding of said fixed-point output data value to a corresponding color data value.

8. The apparatus of claim 5 further comprising fourth logic operable for sending said output color data value to a frame buffer.

9. The apparatus of claim 1 wherein said preselected number of bits is determined in response to said preselected lighting model and said number of bits in said color value.

10. The apparatus of claim 9 wherein a quantization error in an output of said lighting model associated with said preselected number of bits is less than a value represented by a least significant bit in said color value.

11. The apparatus of claim 1 wherein said first and second operands are received from a graphics application program interface (API).

12. A fixed-point graphic method comprising the steps of:
   a first operand to a first fixed point data value having a preselected number of bits, using a first predetermined scaling in response to said preselected number of bits; and
   converting a second operand to a second fixed point data value having said preselected number of bits, using a second predetermined scaling in response to said preselected number of bits and a number of bits in a color data value, wherein said first and second fixed point data values are operable for generating a color data value in accordance with a preselected lighting model, wherein said first predetermined scaling is $(2^n - 1)$, and the second predetermined scaling is $(2^{2n}/2^n - 1) \cdot ((2_m - 1)/2_m)$, and wherein said preselected number of bits is n, and said number of bits in said color data value is m.

13. The method of claim 12 wherein said first and second operands correspond to lighting parameters in accordance with said preselected lighting model.

14. The method of claim 12 further comprising the step of generating one or more color data values in response to one or more first and second fixed-point data values.

15. The method of claim 14 further comprising the step of reducing a fixed-point output data value generated in response to said first and second fixed-point data values to said output color data value.

16. The method of claimed 15 wherein said step of reducing comprises the step of truncating said fixed-point output data value to a corresponding color data value.

17. The method of claim 15 wherein said step of reducing comprises the step of clamped rounding of said fixed-point output data value to a corresponding color data value.

18. The method of claim 15 further comprising the step of sending said output color data value to a frame buffer.

19. The method of claim 12 wherein said preselected number of bits is determined in response to said preselected lighting model and said number of bits in said color value.

20. The method of claim 19 wherein a quantization error in an output of said lighting model associated with said preselected number of bits is less than a value represented by a least significant bit in said color value.

21. The method of claim 12 wherein said first and second operands are received from a graphics application program interface (API).

22. A data processing system comprising:
   a memory;
   a central processing unit (CPU) operable for receiving one or more instructions from said memory; and
   a fixed-point graphics unit operable for receiving one or more first and second floating point operands from said CPU in response to at least one of said one or more instructions, said at least one instruction corresponding to a preselected graphics application program interface (API), and wherein said fixed point graphics unit includes:
      first logic operable for converting said one or more first operands to one or more first fixed point data values having a preselected number of bits, said first logic generating said first fixed point data value using a first predetermined scaling in response to said preselected number of bits; and
      second logic operable for converting said one or more second operands to one or more second fixed point data values having said preselected number of bits, said second logic generating said second fixed point data value using a second predetermined scaling in response to said preselected number of bits and a number of bits in a color data value, wherein said first and second fixed point data values are operable for generating a color data value in accordance with a preselected lighting model corresponding to said API, wherein said first predetermined scaling is $(2^n - 1)$, and said second predetermined scaling is $(2^{2n}/2^n - 1) \cdot ((2^m - 1)/2^m)$, and wherein said preselected number of bits is n, and said number of bits in said color data value is m.

23. The data processing system of claim 22 wherein said preselected number of bits is determined in response to said preselected lighting model and said number of bits in said color value.

24. The data processing system of claim 23 wherein a quantization error in an output of said lighting model associated with said preselected number of bits is less than a value represented by a least significant bit in said color value.

25. The data processing system of claim 22 wherein said fixed-point graphics unit includes a fixed-point arithmetic unit operable for generating one or more color values in response to said one or more first and second fixed-point values.

26. The data processing system of claim 25 wherein said fixed-point arithemetic unit includes third logic operable for reducing a fixed-point output data value generated in response to said first and second fixed-point data values to said output color data value.

27. The data processing system of claim 26 wherein said third logic is operable for truncating said fixed-point output data value to a corresponding color data value.

28. The data processing system of claim 26 wherein said third logic is operable for clamped rounding of said fixed-point output data value to a corresponding color data value.

* * * * *

UNITED STATES PATENT AND TRADEMARK OFFICE
CERTIFICATE OF CORRECTION

PATENT NO.    : 6,559,856 B1
DATED         : May 6, 2003
INVENTOR(S)   : Gordon Clyde Fossum et al.

It is certified that error appears in the above-identified patent and that said Letters Patent is hereby corrected as shown below:

Column 11,
Line 60, before "a first operand" please insert -- converting --.

Signed and Sealed this

Twenty-first Day of October, 2003

JAMES E. ROGAN
*Director of the United States Patent and Trademark Office*